United States Patent
Riedlinger et al.

(10) Patent No.: US 7,590,509 B2
(45) Date of Patent: Sep. 15, 2009

(54) SYSTEM AND METHOD FOR TESTING A PROCESSOR

(75) Inventors: Reid J. Riedlinger, Wellington, CO (US); Douglas John Cutter, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 532 days.

(21) Appl. No.: 11/159,607

(22) Filed: Jun. 23, 2005

(65) Prior Publication Data

US 2006/0290365 A1    Dec. 28, 2006

(51) Int. Cl.
*G21C 17/00* (2006.01)
*G06F 11/00* (2006.01)

(52) U.S. Cl. .................. 702/182; 702/130; 702/183; 702/188; 713/300

(58) Field of Classification Search ......... 702/117–123, 702/181, 182, 188, 189, 191, 130–133, 183, 702/190; 324/760; 713/300
See application file for complete search history.

(56) References Cited

U.S. PATENT DOCUMENTS

| | | | |
|---|---|---|---|
| 5,142,688 A | 8/1992 | Harwood, III | 395/800 |
| 5,202,978 A | 4/1993 | Nozuyama | 395/575 |
| 5,315,242 A | 5/1994 | Enami | 324/158 |
| 5,617,531 A | 4/1997 | Crouch et al. | 395/183.06 |
| 5,654,972 A | 8/1997 | Kuroiwa et al. | 371/22.1 |
| 5,838,578 A | 11/1998 | Pippin | 364/488 |
| 5,841,968 A | 11/1998 | Caldera et al. | 395/183.06 |
| 5,870,614 A | 2/1999 | Ang | 395/750.03 |
| 6,003,141 A | 12/1999 | Ishida | 714/30 |
| 6,032,270 A | 2/2000 | Furukawa et al. | 714/49 |
| 6,047,248 A | 4/2000 | Georgiou et al. | 702/132 |
| 6,131,174 A | 10/2000 | Fischer et al. | 714/733 |
| 6,134,675 A | 10/2000 | Raina | 714/37 |
| 6,172,611 B1 | 1/2001 | Hussain et al. | 340/584 |
| 6,192,479 B1 | 2/2001 | Ko | 713/300 |
| 6,219,723 B1 | 4/2001 | Hetherington et al. | 710/18 |
| 6,275,057 B1 | 8/2001 | Takizawa | 324/765 |
| 6,329,831 B1 | 12/2001 | Bui et al. | 324/765 |
| 6,363,490 B1 * | 3/2002 | Senyk | 713/300 |
| 6,433,568 B1 | 8/2002 | Whipple et al. | 324/760 |
| 6,484,275 B1 | 11/2002 | Josephson et al. | 714/39 |
| 6,487,668 B2 | 11/2002 | Thomas et al. | 713/322 |
| 6,510,400 B1 | 1/2003 | Moriyama | 702/132 |
| 6,518,782 B1 | 2/2003 | Turner | 324/760 |
| 6,615,366 B1 | 9/2003 | Grochowski et al. | 714/10 |
| 6,636,910 B2 | 10/2003 | Kung et al. | 710/60 |
| 6,687,865 B1 | 2/2004 | Dervisoglu et al. | 714/726 |
| 6,732,297 B2 | 5/2004 | Oura | 714/33 |
| 6,799,289 B2 | 9/2004 | Totorica et al. | 714/718 |
| 6,816,983 B2 | 11/2004 | Kurafuji | 714/30 |
| 6,823,240 B2 | 11/2004 | Cooper | 700/299 |
| 6,842,865 B2 | 1/2005 | Nee et al. | 714/28 |
| 6,857,092 B1 | 2/2005 | Fox | 714/733 |

\* cited by examiner

*Primary Examiner*—Eliseo Ramos Feliciano
*Assistant Examiner*—Phuong Huynh

(57) ABSTRACT

A processor comprises a chip, a temperature sensing device, a processor core, and a controller. The temperature sensing device, the processor core, and the controller are integrated on the chip. The controller is configured to set, based on the temperature sensing device, the processor core to a plurality of specified operating points to enable testing of the specified operating points. Each of the operating points is defined by a different temperature and frequency combination, and the processor core is configured to run a set of test codes at each of the operating points.

28 Claims, 5 Drawing Sheets

| Entry | Operating Point | Pass/Fail |
|---|---|---|
| 1 | 74.0, 1.0 | 0 |
| 2 | 74.0, 1.1 | 1 |
| 3 | 74.0, 1.2 | 1 |
| 4 | 74.0, 1.3 | 1 |
| 5 | 74.0, 1.4 | 1 |
| 6 | 74.0, 1.5 | 1 |
| 7 | 74.5, 1.0 | 1 |

SYSTEM AND METHOD FOR TESTING A PROCESSOR

BACKGROUND

Computer systems have one or more processors that manipulate and control the flow of data by executing instructions. To provide more powerful computer systems, processor designers strive to continually increase the operating speed or frequency of the processor. As processor speed increases, the power consumed by the processor tends to increase as well resulting in higher temperatures within the processor. Moreover, increases in processor frequency and temperature can result in unreliable performance and cause errors to occur within the processor. Various techniques have been developed in an effort to optimally control processor temperature and frequency.

For example, some processors include an on-chip controller that adjusts the power supplied to the processor and the operating frequency of the processor based on a measured temperature of the processor. Thus, the processor can run at a higher operating frequency and, if the processor begins to overheat, the controller can reduce the processor's power and frequency until the processor's temperature falls back into a normal operating range. Therefore, the processor can achieve better performance during periods when its temperature is relatively low yet avoid at least some heat-related errors by throttling back power and frequency when the temperature increases above a specified threshold.

Moreover, the operating temperature and frequency of a processor can change while the processor is running. To ensure robustness, extensive testing of the processor is required. For example, before a processor manufacturer releases a product to the public, the manufacturer usually tests the processor at many different operating points to ensure that it operates correctly at the different operating points. As used herein, an "operating point" of a processor is defined by an operating frequency and temperature. Thus, if a processor is tested multiple times at the same operating point, then the processor's operating frequency and temperature are the same for each of the tests. However, if a processor is tested at different operating points for each of a set of tests, then the processor has a different operating temperature or frequency for each of the tests.

To test a processor at multiple operating points, the processor is set to a first operating point by controlling a power signal and a clock signal provided to the processor such that the processor operates of a first temperature and a first frequency. Then, a test code sequence is run on the processor. The running of the test code sequence generates data that is stored and later analyzed to determine whether the processor correctly executed the test code sequence. If the processor correctly executed the test code sequence, then the processor is deemed to have passed the test for the first operating point. However, if an error occurred during the execution of the text code sequence, then the processor is deemed to have failed the test for the first operating point. In such an event, the processor manufacturer may attempt to debug the source of the error.

After performing the test of the processor at the first operating point, the processor is set to a second operating point by adjusting the power signal and/or the clock signal such that the processor operates at another temperature and/or frequency. A test code sequence is then executed by the processor at the second operating point, and the results of such execution are analyzed to determine whether the processor passed or failed the test of the second operating point.

To set the processor to different operating points, external equipment is often used to provide the power signal and the clock signal that control the operating temperature and frequency of the processor. In this regard, an external power source is temporarily interfaced with the processor via an input/output (I/O) interface, which is coupled to the processor through a system bus. By supplying power to the processor during testing, the external power source is able to control the processor's operating power. Further, an external signal generator is also temporarily interfaced with the processor via another I/O interface, which is coupled to the processor through the system bus. By supplying a clock signal to the processor during testing, the external signal generator is able to control the processor's operating frequency. In addition, an external data analyzer is temporarily interfaced with the processor via yet another I/O interface that is coupled to the processor through the system bus, and the data analyzer receives data indicative of the execution results for the test code sequences run for the different operating point tests. The external data analyzer typically determines and logs the pass/fail status for each operating point.

It takes a finite amount of time, typically several seconds, for the external components to set the processor to a given operating point and to log the results of the test at such operating point. Further, many different operating points are tested to ensure sufficient robustness of the processor, and the time required to test all of the operating points can be significant. Indeed, even with a fully automated testing system, it can take several hours to test a desired number of operating points. Further, during the debugging process, it is often necessary to re-run the operating point tests many times to ensure that the detected bugs have been adequately addressed. Unfortunately, the testing and debugging of the processor can significantly delay the introduction of the processor to the consuming public.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for testing processors. A system in accordance with one embodiment of the present disclosure comprises a processor and an on-chip controller for controlling the operating temperature and frequency of the processor. The controller is "on-chip" in the sense that it is packaged on the same integrated circuit (IC) chip as the processor. Thus, the processor and the on-chip controller are integrated on a common substrate within the same package.

During normal operation, the controller adjusts a power signal and a clock signal provided to the processor. In this regard, the controller determines the operating temperature of the processor based on a temperature sensing device within the processor package and provides control signals to a power source and a clock that are both internal to the computer system in which the processor resides. Based on the control signals, the power source and the clock respectively adjust the power and clock signals provided to the processor such that the operating temperature and frequency of the processor remain within a desired range.

During testing, the on-chip controller provides control signals to the internal power source and clock for adjusting the power and clock signals provided to the processor so that the processor can be tested at different operating points. By using the on-chip controller, instead of external components to control the operating temperature and frequency of the processor during testing, the time required to test the processor for many different operating points can be significantly reduced.

Figure 1:
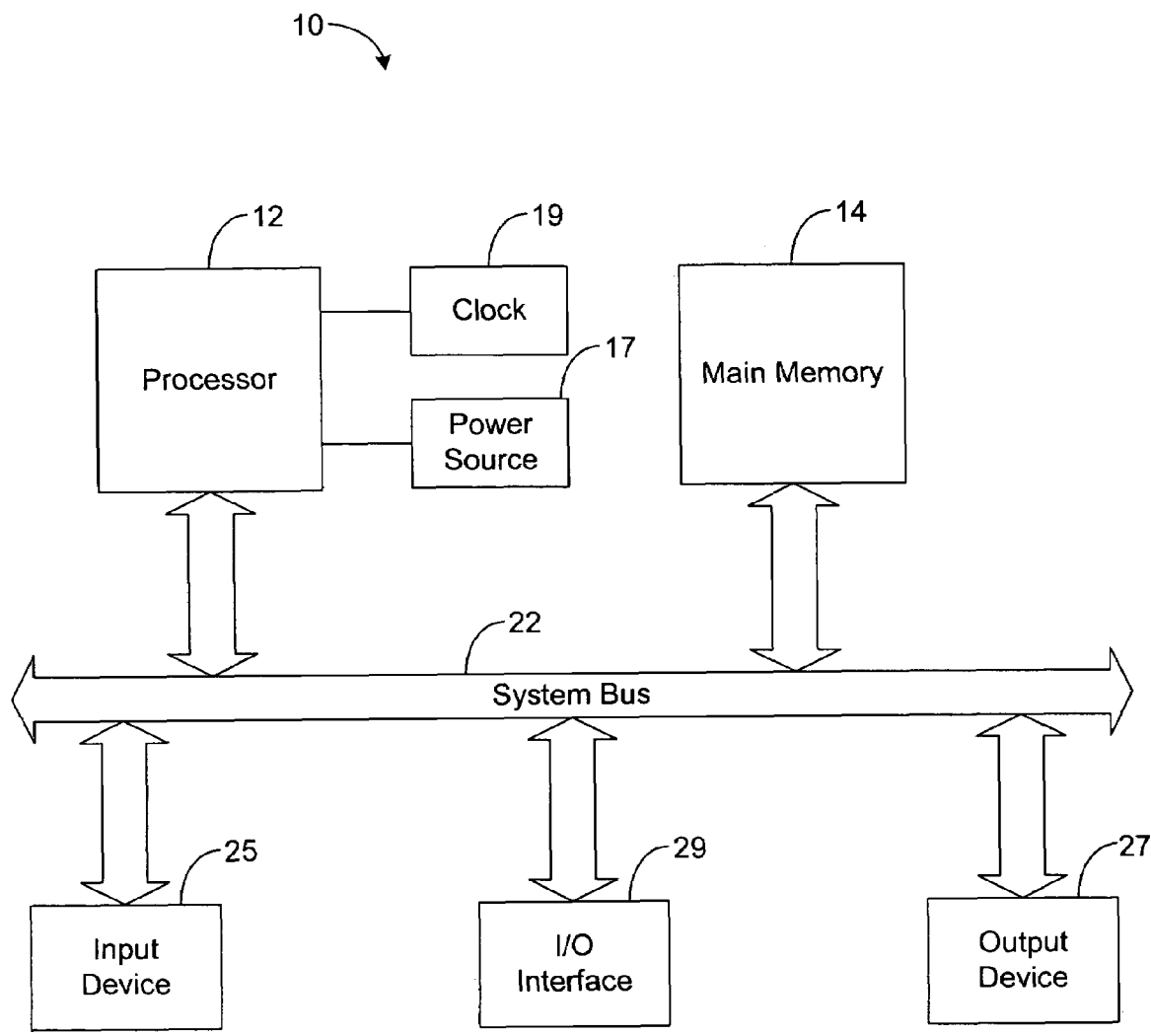
FIG. 1 is a block diagram illustrating a computer system in accordance with one exemplary embodiment of the present disclosure.

FIG. 1 depicts a computer system 10 in accordance with an exemplary embodiment of the present disclosure. As shown by FIG. 1, the system 10 comprises at least one processor 12 for executing instructions of computer code that may be stored in the system 10, such as in main memory 14. The processor 12 is coupled to and receives a power signal from a power source 17. Also, the processor 12 is coupled to and receives a clock signal from a clock 19. The power signal from the power source 17 and the clock signal from the clock 19 control the operating temperature and frequency of the processor 12.

The system 10 of FIG. 1 also comprises a system bus 22 over which the processor 12 communicates data with the main memory 14 and other system components, such as an input device 25, an output device 27, and an I/O interface 29. The input device 25, for example, a keyboard or a mouse, can be used to input data from a user of the system 10, and the output device 27, for example, a printer or monitor, can be used to output data to the user. The I/O interface 29 can comprise various known or future-developed interfaces (e.g., a universal serial bus (USB) port) that enable communication with external devices.

Indeed, various external devices may be interfaced with the I/O interface 29. For example, if the processor 12 is to be tested at different operating points via conventional techniques, as described above, the I/O interface 29 may be coupled to an external power source (not shown), clock (not shown), and data analyzer (not shown). However, as will be described in more detail hereafter, the processor 12 is preferably tested at various operating points using the power source 17 and the clock 19 that are internal to the system 10 and, in particular, located closer to the processor 12 than any external components that may be interfaced with the I/O interface 29, which is coupled to the processor 12 via system bus 22.

Figure 2:
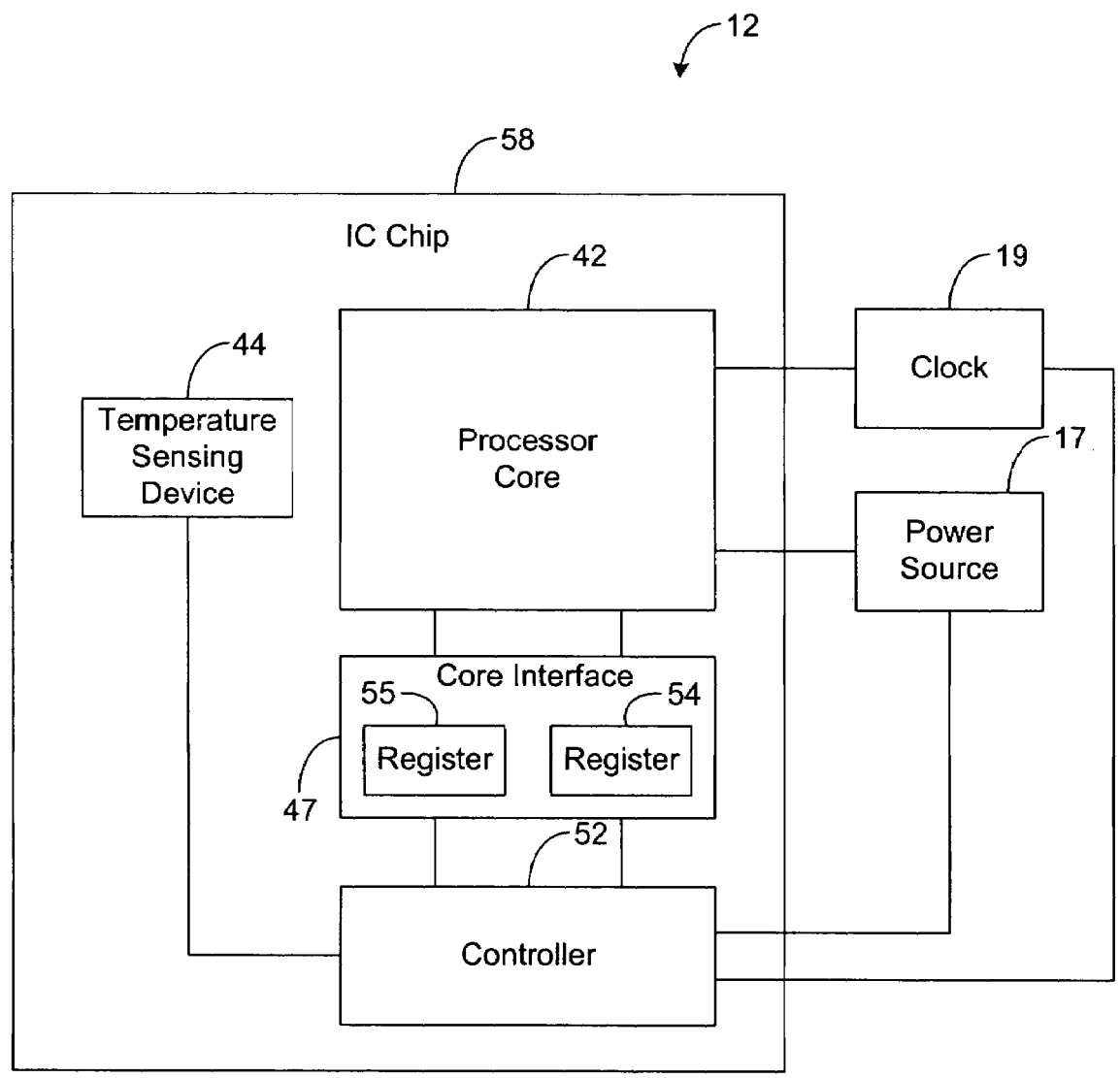
FIG. 2 is a block diagram illustrating an exemplary processor, such as is depicted in FIG. 1.

FIG. 2 depicts a more detailed view of the processor 12. As shown by FIG. 2, the processor 12 comprises a processor core 42 for executing instructions. The core 42 may include one or more pipelines (not specifically shown) that execute instructions in stages in accordance with many conventional processor cores. As shown by FIG. 2, the processor 12 comprises a temperature sensing device 44, which can be used to determine an approximate operating temperature of the processor core 42. In one embodiment, the temperature sensing device 44 is a diode, although other types of temperature sensing devices may be used in other embodiments.

The processor core 42 is electrically coupled to a core interface 47 that provides a communication interface between the processor core 42 and a controller 52. In this regard, the core interface 47 comprises a core output register 54 that buffers data transmitted from the processor core 42 and a core input register 55 that buffers data transmitted from the controller 52. The controller 52 can be implemented in hardware, software, or a combination thereof. In one embodiment, the controller 52 comprises a microprocessor that fits in the same IC package as the processor core 42 and core interface 47. However, other types of components may be used to implement the controller 52 in other embodiments.

The controller 52 is electrically coupled to the temperature sensing device 44, the power source 17, and the clock 19. By transmitting control signals to the power source 17 and the clock 19, the controller 52 is able to adjust the power signal and the clock signal provided to the processor core 42. During normal operation, the controller 52 detects the operating temperature of the processor core 42 based on the temperature sensing device 44 and adjusts the power and clock signal provided to the processor core 42 in order to keep the operating temperature and frequency of the core 42 within a desired range.

For example, if the operating temperature of the core 42 exceeds a specified upper threshold, the controller 52 may reduce the voltage of the power signal and/or the frequency of the clock signal in an effort to reduce the core's operating temperature. If, on the other hand, the operating temperature falls below a specified lower threshold, the controller 52 may increase the voltage of the power signal and/or the frequency of the clock signal in an effort to increase the core's performance. U.S. Pat. No. 6,363,490, entitled "Method and Apparatus for Monitoring the Temperature of a Processor," and filed on Mar. 30, 1999, which is incorporated herein by reference, describes exemplary techniques that may be used to control the operating temperature and frequency of the core 42. Further, it is possible for the processor 12 to have additional cores (not shown) to increase the performance of the processor 12.

As shown by FIG. 2, the processor core 42, core interface 47, and controller 52 are preferably packaged together and integrated on a single IC chip 58. The power source 17 and clock 19 may be coupled to I/O pins (not shown) of the IC chip 58, and may reside on the same printed circuit board (PCB) as the IC chip 58. However, in other embodiments, the power source 17 and clock 19 may reside on one more separate PCBs that are interfaced with the PCB of the IC chip 58.

Figures 3, 4:
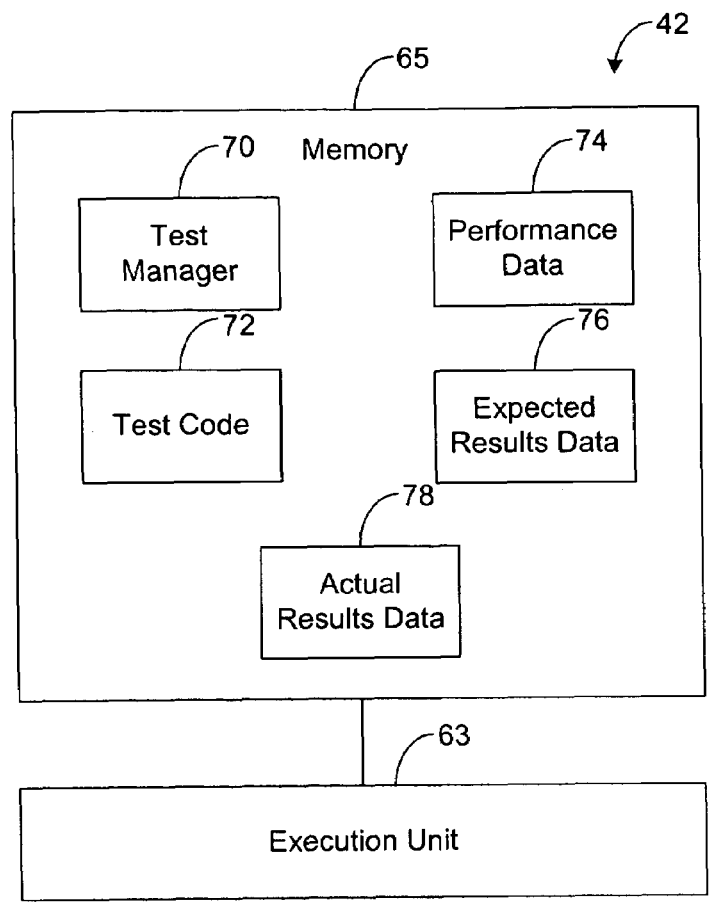
FIG. 3 is a block diagram illustrating an exemplary processor core, such as is depicted in FIG. 2.
FIG. 4 is a diagram illustrating an exemplary tabular format for performance data depicted in FIG. 3.

FIG. 3 depicts a more detailed view of the processor core 42. As shown by FIG. 3, the processor core 42 comprises, an execution unit 63 and memory 65. The execution unit 63 comprises circuitry (not specifically shown), such as one or more pipelines, for executing instructions. The memory 65 stores a test manager 70, test code 72, performance data 74, expected results data 76, and actual results data 78.

The test manager 70 controls testing of the processor core 42, as will be described in more detail hereafter. In the embodiment shown by FIG. 3, the test manager 70 is implemented in software. However, in other embodiments, the test manager 70 may be implemented in hardware or a combination of hardware and software. Further, the test manager 70, when implemented in software, may be executed by the execution unit 63 of the core 42 in which the test manager 70 is stored. However, it is possible for the test manager 70 to be executed by other cores in other embodiments, and it is possible for the test manager 70 to be stored in memory external to the core 42 being tested by the test manager 70.

During testing, the test manager 70 is configured to request the controller 52 (FIG. 2) to control the operating temperature and frequency of the processor core 42 so that different operating points of the core 42 can be tested. To test an operating point, the test manager 70 causes the execution unit 63 to run the test code 72 while the core 42 is operating at the temperature and frequency of the operating point. The test code 72 is a predefined set of instructions that when correctly executed by the processor core 42 causes the core 42 to generate data corresponding to the expected results data 76. As an example, the expected results data 76 may define a particular value that should be stored in a register (not specifically shown) of the core 42 at the end of execution of the test code 72. Thus, if the particular value is not stored in such register at the end of execution of the test code 72, then an error has occurred. Similarly, the expected results data 76 may include expected values for various other registers and other types of memory. Moreover, the expected results data 76 can be compared to the data generated by the processor core 42 in executing the test code 72 to determine whether the processor core 42 has correctly executed the test code 72 for the operating point being tested.

Thus, for each operating point, the controller 52 sets the operating temperature and frequency of the core 42 to that of the respective operating point, and the processor core 42 executes the test code 72 thereby generating data, which is represented as actual results data 78 in FIG. 3. Upon execution of the test code 72, the test manager 70 compares the actual results data 78 to the expected results data 76 to determine whether the core 42 has correctly executed the test code 72. If the core 42 has correctly executed the test code 72, the test manager 70 stores, in performance data 74, a "pass" indication for the operating point. If the test manager 70 detects an error based on the comparison of the actual results data 78 to the expected results data 76, then the test manager 70 stores, in performance data 74, a "fail" indication for the operating point. Thus, the performance data 74 is essentially a log that associates each operating point with a pass or fail indication. Accordingly, the performance data 74 can be analyzed to determine at which operating points the processor core 42 erroneously executed the test code 72. Such information may then be used to debug the processor core 42.

Various formats of the performance data 74 are possible. In one embodiment, the performance data 74 is a table of pass/fail indications for the tested operating points. For example, FIG. 4 depicts an exemplary table having entries for various exemplary operating points. The entries 1-6 of FIG. 4 correspond to operating points defined by the same temperature (74.0 degrees Celsius) but different frequencies. In particular, assuming that the frequencies are expressed in gigahertz (GHz), the frequencies of entries 1-6 increase by 0.1 GHz for each entry such that the operating point of entry 1 is defined by a frequency of 1.0 GHz and the operating point of entry 6 is defined by 1.5 GHz. The remaining entry 7 corresponds to an operating point defined by a temperature of 74.5 degrees Celsius and a frequency of 1.0 GHz.

As shown by FIG. 4, the entries of the exemplary table include data indicative of both the temperature and the frequency of the corresponding operating point and a one-bit pass or fail indication. In this regard, the pass or fail indication may be asserted (e.g., set to a logical "1") if the processor core 42 passed the test of the corresponding operating point. In particular, the pass or fail indication may be asserted if the test manager 70, during testing, determined that the processor core 42 correctly executed the test code 72 for the corresponding operating point. Otherwise, the pass or fail indication may be deasserted (e.g., set to a logical "0") to indicate that the processor core 42 failed the test of the corresponding operating point. Thus, the exemplary table of FIG. 4 indicates that the processor core 42 passed all of the operating point tests except for the test of the operating point defined by a temperature of 74.0 degrees Celsius and a frequency of 1.0 GHz. Other types of formats for the performance data 74 are possible in other embodiments.

At the beginning of testing, the processor core 42 is preferably operating at a safe operating point. A "safe" operating point refers to an operating temperature and frequency that are sufficiently low such that processor errors are unlikely. The test manager 70 specifies a set of operating points to be tested and generally controls testing of each operating point according to an exemplary methodology depicted by FIG. 5. In this regard, to test a particular operating point, the test manager 70 transmits an operating point change request to the controller 52, as depicted by block 102 in FIG. 5. Such a request includes data indicative of the temperature and frequency of the operating point to be tested.

The operating point change request is buffered in the core output register 54. The controller 52 reads the operating point change request from the register 54 and, in response, changes the operating temperature and frequency of the core 42 to the requested temperature and frequency. In this regard, upon receiving the operating point change request, the controller 52 transmits a control signal to the power source 17 indicating that the voltage of the power signal provided to the processor core 42 is to be increased by a specified amount, as depicted by blocks 111 and 114 of FIG. 6. The power source 17 preferably includes circuitry (not specifically shown) that receives the control signal from the controller 52 and adjusts the voltage of the power signal based on the control signal. In particular, the power source 17 increases the power signal voltage by the specified amount. The power source 17 also transmits an acknowledgement or other message to the controller 52 once the power signal voltage has been increased by the specified amount.

Figure 6:
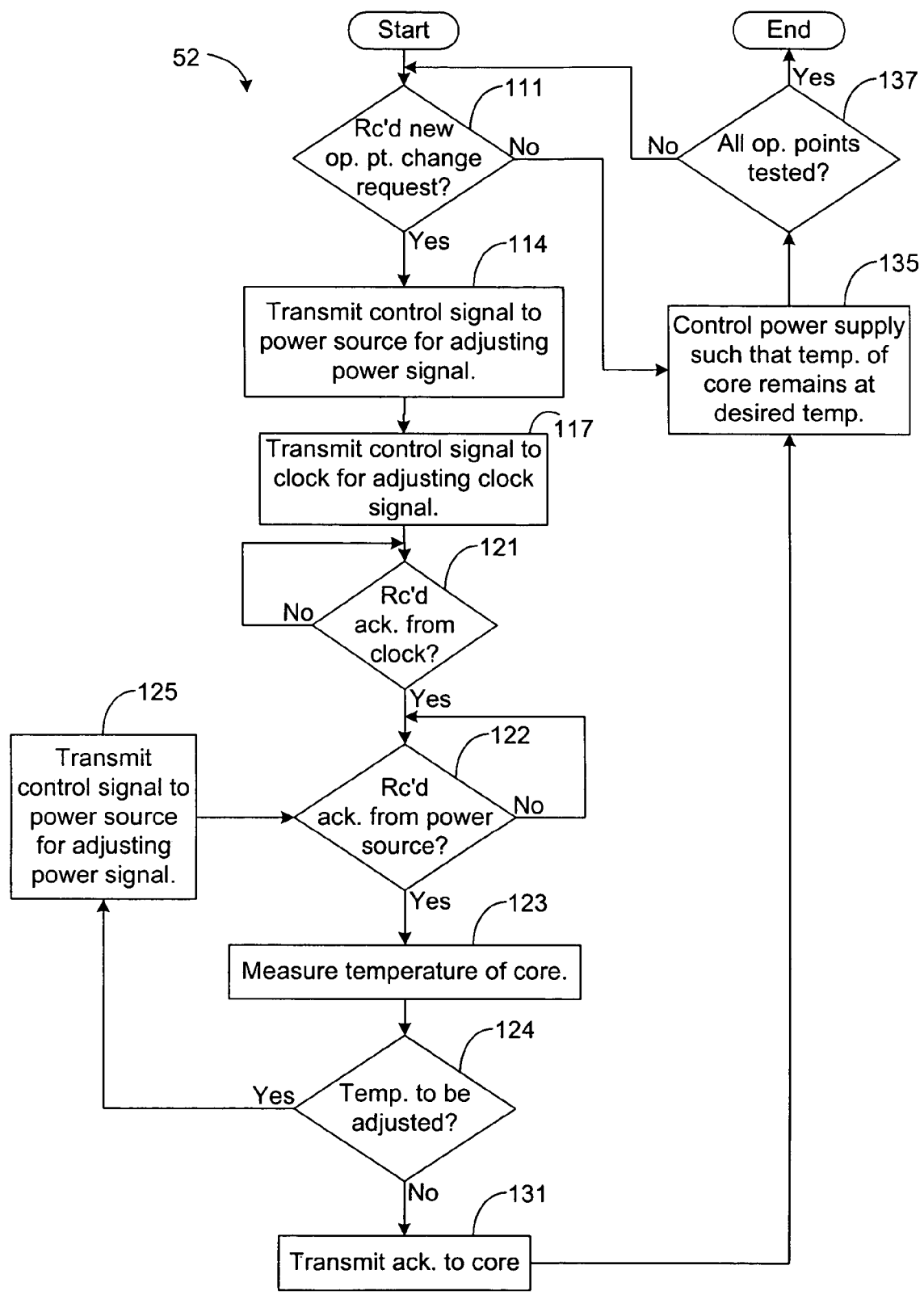
FIG. 6 is a flow chart illustrating an exemplary architecture and functionality of a controller depicted in FIG. 2.

The controller 52 also transmits a control signal to the clock 19 indicating that the frequency of the clock signal provided to the core 42 is to be increased to the frequency indicated by the operating point change request, as depicted by block 117 of FIG. 6. The clock 19 preferably includes circuitry (not specifically shown) that receives the control signal from the controller 52 and, in response, increases the frequency of the clock signal to the requested frequency. Once the clock signal's frequency reaches the requested frequency, the clock 19 transmits an acknowledgement or other message to the controller 52.

Once the controller 52 has received acknowledgements or other messages from the power source 17 and clock 19 indicating that the power signal voltage and the clock signal frequency have been increased by the requested amounts, the controller 52 measures the temperature of the core 42 based on the temperature sensing device 44, as depicted by blocks 121-123. Based on the sensed core temperature, the controller 52 requests further adjustments of power signal voltage until the temperature sensed via the temperature sensing device 44 substantially matches the requested temperature (i.e., the temperature indicated by the operating point change request). In particular, the controller 52 determines whether the operating temperature of the core 42 is approximately equal to the requested temperature. If not, then the operating temperature is to be adjusted, and the controller 52 transmits, to the power source 17, a control signal for adjusting the voltage of the power signal such that the core temperature moves closer to the requested temperature, as depicted by blocks 124 and 125. The controller 52 repeats blocks 122-125 until the core temperature, as measured via the temperature sensing device 44, is approximately equal to the requested temperature.

Once the clock frequency is set to the requested frequency (i.e., the frequency indicated by the operating point change request) and the core temperature is set to the requested temperature, the controller 52 transmits an acknowledgement or other message indicating that the operating temperature and frequency of the core 42 have been set as requested, as indicated by block 131 of FIG. 6. Such an acknowledgement or other message is buffered by the core input buffer 55 and is read by the test manager 70. The controller 52 also controls the power source 17 such that the operating temperature of core 42 remains approximately at the requested temperature until the next operating point change request is received or until all of the specified operating points have been tested, as depicted by blocks 135 and 137.

Figure 5:
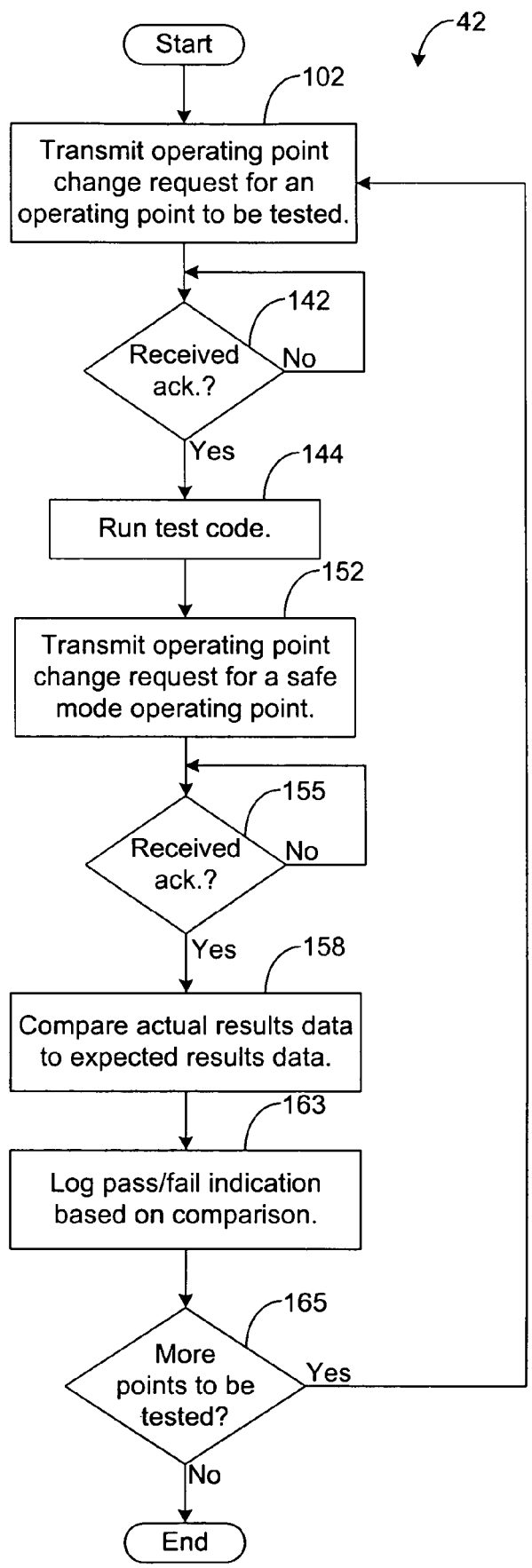
FIG. 5 is a flow chart illustrating an exemplary architecture and functionality of the processor core depicted in FIG. 3.

Upon reading the foregoing acknowledgement or other message transmitted in block 131, the test manager 70 initiates execution of the test code 72 by the core 42, as depicted by blocks 142 and 144 of FIG. 5. Once execution of the test code 72 has completed, the test manager 70 transmits another operating point change request indicating that the operating temperature and frequency of the core 42 is to be set to the safe operating point, as depicted by block 152. This request is buffered by the core output buffer 54 and is read by the controller 52. In response, the controller 52 changes the operating temperature and frequency of the core 42 to the requested temperature and frequency according to the exemplary methodology depicted by FIG. 6. In this regard, the controller 52 transmits a control signal to the power source 17 indicating that the voltage of the power signal provided to the processor core 42 is to be decreased by a specified amount. The power source 17 receives the control signal and decreases the power signal voltage by the specified amount. In addition, the power source 17 transmits an acknowledgement or other message to the controller 52 once the power signal voltage has been decreased by the specified amount.

The controller 52 also transmits a control signal to the clock 19 indicating that the frequency of the clock signal provided to the core 42 is to be decreased to the frequency indicated by the operating point change request (i.e., the frequency of the safe operating point). The clock 19 receives the control signal from the controller 52 and, in response, decreases the frequency of the clock signal to the requested frequency. Once the clock signal's frequency reaches the requested frequency, the clock 19 transmits an acknowledgement or other message to the controller 52.

Once the controller 52 has received acknowledgements or other messages from the power source 17 and clock 19 indicating that the power signal voltage and clock signal frequency have been decreased by the requested amounts, the controller 52 monitors the temperature of the core 42 based on the temperature sensing device 44. Based on the sensed core temperature, the controller 52 requests further adjustments of the power signal voltage until the temperature sensed via the temperature sensing device 44 matches the temperature indicated by the most recent operating point change request. Once the power signal voltage and the clock frequency are set as requested, the controller 52 transmits an acknowledgement or other message indicating that the operating temperature and frequency of the core 42 have been set as requested (i.e., to the safe operating point in the instant example). Such an acknowledgement or other message is buffered by the core input buffer 55 and is read by the test manager 70.

Upon reading the foregoing acknowledgment, the test manager 70 compares the expected results data 76 and the actual results data 78 to determine whether the processor core 42 correctly executed the test code 72 for the operating point being tested, as depicted by blocks 155 and 158 of FIG. 5. The test manager 70 then stores a pass or fail indication for such operating point in the performance data 74, as indicated by block 163. By performing the comparison of the expected results data 76 to the actual results data 78 while the core 42 is operating at the safe operating point instead of the operating point being tested, errors in performing the comparison may be prevented.

Upon completing a test of an operating point, the test manager 70 determines whether there are more operating points to be tested, as depicted by block 165 of FIG. 5. To test another operating point, the test manager 70 repeats the aforedescribed methodology and transmits a new operating point change request indicating the temperature and frequency of the new operating point. Indeed, the aforedescribed methodology may be repeated as desired to test a desired number of operating points.

The test manager 70, if desired, may interface the performance data 74 with an external device or user. For example, the test manager 70 may transmit the performance data 74 to the output device 27 (FIG. 1), which displays the data to a user. Alternatively, the test manager 70 may transmit the performance data 74 to an external device (not shown) via the I/O interface 29 (FIG. 1).

Note that it is unnecessary for the test manager 70 or any other component of the computer system 10 to perform the comparisons between the expected results data 76 and the actual results data 78. In this regard, it is possible for the test manager 70 to transmit the actual results data 78 to another device for analysis. For example, the test manager 70 may transmit the actual results data 78 to an external data analyzer (not shown) via the I/O interface 29 (FIG. 1). In such embodiments, it is unnecessary for the expected results data 76 and the performance data 74 to be stored in memory 65.

Now, therefore, the following is claimed:

1. A processor, comprising:
    an integrated circuit (IC) chip;
    a temperature sensing device integrated on the chip;
    a processor core integrated on the chip; and
    a controller integrated on the chip, the controller configured to set, based on the temperature sensing device and in response to operating point change requests from a test manager, the processor core to a plurality of specified operating points to enable testing of the specified operating points, each of the operating points defined by a different temperature and frequency combination, each of the requests specifying a different operating point to be tested for the processor core, wherein the processor core, for each of the requests, is configured to run a set of test codes at the operating point specified by the request;
    wherein the processor core, for one of the specified operating points, is configured to determine whether the processor core correctly executed the set of test codes while operating at the one specified operating point and to provide an indication as to whether the processor core determined that the processor core correctly executed the test code for the one operating point.

2. The processor of claim 1, wherein one of the operating points is defined by a temperature and a frequency, and wherein the controller is configured to transmit control signals for adjusting a power signal provided to the processor such that a temperature of the core remains at the temperature of the one operating point while the set of test codes is being executed for the one operating point.

3. The processor of claim 1, wherein the controller, during a testing mode, is configured to ensure that a temperature and a frequency of the processor core remain at a respective one of the specified operating points while the test code is being executed, and wherein the controller, during a normal operating mode, is configured to dynamically adjust the temperature and the frequency of the processor core based on whether a temperature sensed via the temperature sensing device exceeds a specified threshold.

4. The processor of claim 1, wherein the processor core is configured to transmit the operating point change requests to the controller, and wherein the controller, for each of the operating point change requests, is configured to transmit control signals for respectively setting a temperature and a frequency of the processor core to the temperature and the frequency indicated by the operating point change request.

5. The processor of claim 1, wherein the controller is coupled to a power source and a clock, and wherein the controller, for each of the specified operating points, is configured to transmit control signals to the power source and the clock for setting a temperature and a frequency of the processor core to a temperature and a frequency of the respective operating point.

6. The processor of claim 1, wherein the test manager is configured to associate each of the specified operating points with an indication as to whether the processor core executed the set of test codes without error while operating at a temperature and a frequency of the respective operating point.

7. The processor of claim 1, further comprising a core interface configured to buffer messages communicated between the processor core and the controller.

8. The processor of claim 1, wherein the controller is configured to transmit a message indicating that the processor core has been set to one of the operating points, and wherein the processor core is configured to run the set of test codes in response to the message.

9. The processor of claim 1, wherein the test manager is configured to run on the processor core.

10. The processor of claim 1, wherein the test manager, for one of the operating points, is configured to receive a set of execution results generated by the processor core via execution of the set of test codes at the one operating point, the test manager configured to perform a comparison between the set of execution results to a predefined set of expected execution results and to provide an indication whether the processor core correctly executed the set of test codes for the one operating point based on the comparison.

11. The processor of claim 1, wherein the processor core is configured to associate the indication with the one specified operating point.

12. A system for testing a processor, comprising:
an integrated circuit (IC) package having a processor core, a temperature sensing device, and a controller integrated on a single chip;
a power source;
a clock; and
a test manager configured to test a plurality of operating points for the processor core, each of the operating points defined by a different temperature and frequency combination, wherein the test manager is configured to transmit operating point change requests to the controller, each operating point change request specifying a different one of the operating points to be tested for the processor core, wherein the test manager, for each of the specified operating points, is configured to cause the processor core to execute a set of test codes while operating at a temperature and a frequency of the respective operating point, wherein the controller, for each of the operating point change requests, is configured to control the power source, based on the temperature sensing device, and to control the clock such that the processor core operates at the temperature and the frequency of the operating point specified by the operating point change request.

13. The system of claim 12, wherein the test manager is configured to associate each of the specified operating points with an indication as to whether the processor core correctly executed the set of test codes while operating at a temperature and a frequency of the respective operating point.

14. The system of claim 12, wherein the controller, in response to each operating point change request, is configured to transmit control signals for causing the processor core to operate at the temperature and the frequency indicated by the operating point change request.

15. The system of claim 12, wherein the temperature sensing device comprises a diode.

16. The system of claim 12, wherein the test manager is stored in and executed by the processor core.

17. The system of claim 12, wherein the test manager, for one of the operating points, is configured to receive a set of execution results produced by the processor core via execution of the set of test codes at the one operating point, the test manager configured to perform a comparison between the set of execution results to a predefined set of expected execution results and to provide an indication whether the processor core correctly executed the set of test codes for the one operating point based on the comparison.

18. A system, comprising:
means for specifying an operating point of a processor core to be tested;
means for sensing a temperature of the processor core;
means for controlling a power signal and a clock signal provided to the processor core such that the processor core operates at a temperature and a frequency of the specified operating point, the controlling means based on the sensing means and the specifying means, wherein the controlling means, the sensing means, and the processor core are integrated on a single integrated circuit (IC) chip; and
means for testing the operating point, the testing means configured to cause the processor core to execute a set of test codes while the processor core is operating at the temperature and the frequency and to determine whether the processor core correctly executed the set of test codes by comparing a predefined set of expected execution results to a set of execution results generated by the processor core while executing the set of test codes, the testing means further configured to associate the operating point with an indication as to whether the processor core correctly executed the set of test codes.

19. The system of claim 17, wherein the testing means is integrated on the chip.

20. The system of claim 17, wherein the processor core is configured to transmit, to the controlling means, an operating point change request indicative of the temperature and the frequency of the specified operating point.

21. A method for testing processors, comprising:
specifying an operating point of a processor to be tested, the processor having an integrated circuit (IC) chip with a temperature sensing device, a processor core, and a controller integrated thereon;
sensing a temperature of the processor core via the temperature sensor;

transmitting, based on the sensed temperature and the specified operating point, at least one control signal from the controller;

setting an operating temperature of the processor core to a temperature of the specified operating point based on the at least one control signal;

setting an operating frequency of the processor core to a frequency of the specified operating point based on the at least one control signal;

executing code while the operating temperature and the operating frequency are respectively set to the temperature and the frequency of the specified operating point thereby generating data;

comparing the data to a predefined set of expected execution results; and indicating, based on the comparing, whether the processor core correctly executed the code via the executing.

22. The method of claim 21, wherein the indicating comprises associating the operating point with a pass or fail indication.

23. The method of claim 21, further comprising transmitting, to the controller, an operating point change request indicative of the temperature and the frequency of the specified operating point, wherein the setting an operating temperature and the setting an operating frequency are based on the operating point change request.

24. The processor of claim 1, wherein the controller, for one of the specified operating points, is configured to set the processor core to the one specified operating point and to initiate execution of the set of test codes in response to a determination that a temperature sensed by the temperature sensing device matches a temperature of the one specified operating point.

25. The computer system of claim 12, wherein one of the operating point change requests specifies a temperature and a frequency for one of the operating points, and wherein the controller is configured to set the processor core to the temperature and the frequency of the one operating point in response to the one operating point change request.

26. The computer system of claim 25, wherein the controller is configured to initiate execution of the set of test codes in response to a determination that a temperature sensed by the temperature sensing devices matches the temperature of the one operating point.

27. The computer system of claim 26, wherein the test manager is configured to indicate whether the processor core passed a test for the one operating point based on the execution of the set of test codes initiated in response to the determination.

28. A method for testing processors, comprising:

specifying an operating point of a processor to be tested, the processor having an integrated circuit (IC) chip with a temperature sensing device, a processor core, and a controller integrated thereon;

performing a test for the specified operating point, the performing comprising:

receiving a request to set the processor to the specified operating point;

sensing a temperature of the processor core via the temperature sensor;

setting, via the controller, an operating temperature of the processor core to a temperature of the specified operating point based on the sensed temperature;

setting, via the controller, an operating frequency of the processor core to a frequency of the specified operating point;

indicating when the operating temperature of the processor core has been set to the temperature of the specified operating point in response to the request and when the operating frequency of the processor core has been set to the frequency of the specified operating point in response to the request;

executing test code in response to the indicating thereby generating data;

comparing data to an expected execution result; and indicating, based on the comparing, a status of the test.

* * * * *

UNITED STATES PATENT AND TRADEMARK OFFICE
CERTIFICATE OF CORRECTION

PATENT NO. : 7,590,509 B2  Page 1 of 1
APPLICATION NO. : 11/159607
DATED : September 15, 2009
INVENTOR(S) : Reid J. Riedlinger et al.

It is certified that error appears in the above-identified patent and that said Letters Patent is hereby corrected as shown below:

In the Claims:

In column 10, line 55, in Claim 19, delete "claim 17," and insert -- claim 18, --, therefor.

In column 10, line 57, in Claim 20, delete "claim 17," and insert -- claim 18, --, therefor.

Signed and Sealed this

Nineteenth Day of October, 2010

David J. Kappos
*Director of the United States Patent and Trademark Office*